United States Patent
Peng et al.

(10) Patent No.: US 9,583,675 B1
(45) Date of Patent: Feb. 28, 2017

(54) WHITE LED

(71) Applicant: OPTO TECH CORPORATION, Hsinchu (TW)

(72) Inventors: Lung-Han Peng, Taipei (TW); Hong-Chih Tang, New Taipei (TW); Ming-Yi Yan, Taoyuan (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days.

(21) Appl. No.: 15/057,311

(22) Filed: Mar. 1, 2016

(30) Foreign Application Priority Data

Dec. 8, 2015 (TW) .............................. 104141146 A

(51) Int. Cl.
| H01L 29/06 | (2006.01) |
| H01L 33/06 | (2010.01) |
| H01L 33/16 | (2010.01) |
| H01L 33/26 | (2010.01) |

(52) U.S. Cl.
CPC .............. *H01L 33/06* (2013.01); *H01L 33/16* (2013.01); *H01L 33/26* (2013.01)

(58) Field of Classification Search
CPC .......... H01L 33/06; H01L 33/16; H01L 33/26
USPC ......................................................... 257/13
See application file for complete search history.

(56) References Cited

U.S. PATENT DOCUMENTS

| 8,981,373 B1 | 3/2015 | Peng et al. | |
| 2006/0081873 A1 | 4/2006 | Osinsky et al. | |
| 2015/0091019 A1* | 4/2015 | Peng | H01L 33/06 257/77 |

FOREIGN PATENT DOCUMENTS

| TW | 201115630 | 5/2011 |
| TW | 201230388 | 7/2012 |

OTHER PUBLICATIONS

Y. P. Song et al. "Luminescence emission originating from nitrogen doping of β—Ga2O3 nanowires," Electron Microscopy Laboratory, Peking University, Peping, Beijing, China, Physical Review B (Impact Factor: 3.74). Feb. 2004; 69. DOI: 10.1103/PhysRevB.69.075304.

Li-Wei Chang et al., "Effect of the doped nitrogen on the optical properties of β—Ga2O3 nanowires," Materials Letters, vol. 65, Issue 14, Jul. 31, 2011, pp. 2281-2283, ISSN 0167-577X, http://dx.doi.org/10.1016/j.matlet.2011.04.036.

Li-Wei Chang et al., "Modulation of luminescence emission spectra of N-doped β—Ga2O3 nanowires by thermal evaporation," Thin Solid Films, vol. 518, Issue 5, Dec. 31, 2009, pp. 1434-1438, ISSN 0040-6090, http://dx.doi.org/10.1016/j.tsf.2009.09.064.

Taiwan Intellectual Property Office, "Office Action", issued on Oct. 13, 2016.

* cited by examiner

*Primary Examiner* — Tu-Tu Ho
(74) *Attorney, Agent, or Firm* — WPAT, PC; Justin King

(57) ABSTRACT

A white LED includes a P-type layer, a tunneling structure, an N-type layer, an N-type electrode, and a P-type electrode. The tunneling structure is in contact with the P-type layer. The tunneling structure is a stack structure comprising a first barrier layer, a first active layer and a second barrier layer. At least one of the first barrier layer, the first active layer and the second barrier layer is a first metal nitride oxide layer. The N-type layer is in contact with the tunneling structure. The N-type electrode is in contact with the N-type layer. The P-type electrode is in contact with the P-type layer.

12 Claims, 3 Drawing Sheets

WHITE LED

This application claims the benefit of Taiwan Patent Application No. 104141146, filed Dec. 8, 2015, the subject matter of which is incorporated herein by reference.

FIELD OF THE INVENTION

The present invention relates to a white LED, and more particularly to a white LED including a tunneling structure formed by metal nitride oxide layers.

BACKGROUND OF THE INVENTION

Recently, white light diodes (referred to as white LED) are introduced into the market. Since the white LED has the power-saving benefits, the white LED will gradually replace the conventional fluorescent tube.

Generally, the current white LED uses a phosphor to mix yellow light with blue light to produce white light. For example, when the blue light with a peak wavelength in the range between 450 and 470 nm is absorbed by a yellow phosphor YAG:Ce, a light with a peak wavelength in the range between 550 and 560 nm and a radiation wavelength in the range between 450 and 700 nm is generated. Consequently, the blue light and the yellow light are mixed to produce the white light.

FIG. 1 schematically illustrates the spectrum of a white LED that is produced by a conventional blue LED and a YAG phosphor. As shown in FIG. 1, the high-brightness blue LED with a peak wavelength in the range between 445 and 450 nm is used to excite the YAG phosphor. Since the blue color and the yellow color are two complementary colors, the blue light and the yellow light may be mixed to produce the white color. In other words, the conventional blue LED and the YAG phosphor may be combined as a white LED.

Besides, a UV LED with a peak wavelength in the range between 350 and 430 nm may be used to excite an RGB phosphor. Consequently, the UV light and the RGB light are mixed to produce the white color.

Moreover, another white LED is disclosed in U.S. Pat. No. 8,981,373. The white LED includes a tunneling structure that is formed by a stack structure of metal oxide layers.

SUMMARY OF THE INVENTION

An embodiment of the present invention provides a white LED. The white LED includes a P-type layer, a tunneling structure, an N-type layer, an N-type electrode, and a P-type electrode. The tunneling structure is in contact with the P-type layer. The tunneling structure is a stack structure comprising a first barrier layer, a first active layer and a second barrier layer. At least one of the first barrier layer, the first active layer and the second barrier layer is a first metal nitride oxide layer. The N-type layer is in contact with the tunneling structure. The N-type electrode is in contact with the N-type layer. The P-type electrode is in contact with the P-type layer.

Another embodiment of the present invention provides a white LED. The white LED includes a P-type layer, a tunneling structure, an N-type layer, an N-type electrode, and a P-type electrode. The tunneling structure is in contact with the P-type layer. The tunneling structure includes plural material layers. AT least one of the plural material layers is a first metal nitride oxide layer. The N-type layer is in contact with the tunneling structure. The N-type electrode is in contact with the N-type layer. The P-type electrode is in contact with the P-type layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a novel white LED. The white LED does not contain any phosphor, but is capable of emitting a white light.

Figure 1:
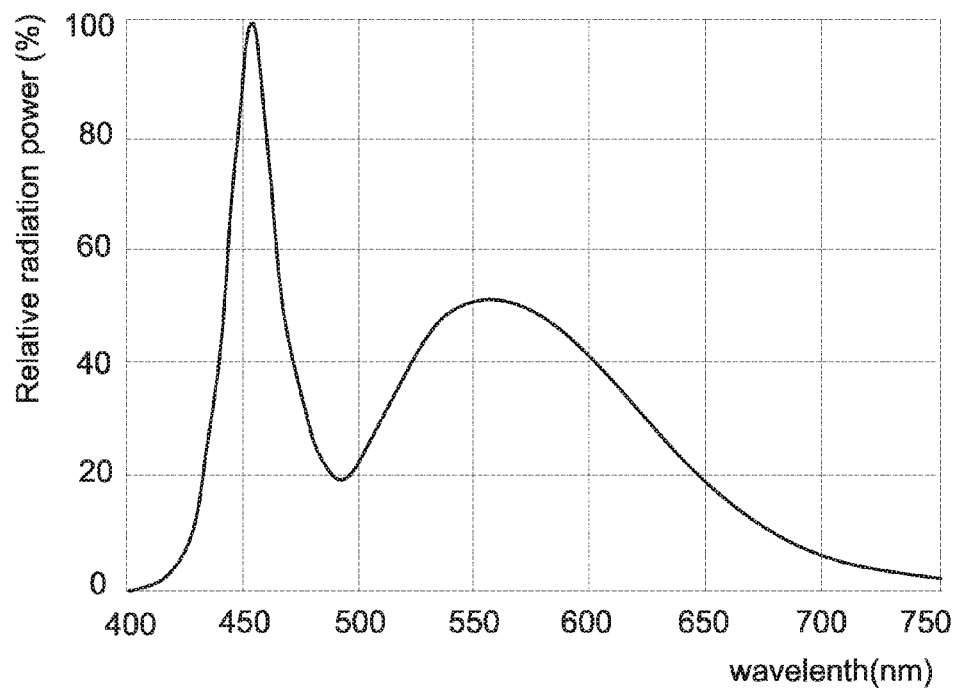
FIG. 1 (prior art) schematically illustrates the spectrum of a white LED that is produced by a conventional blue LED and a YAG phosphor.
Figure 2:
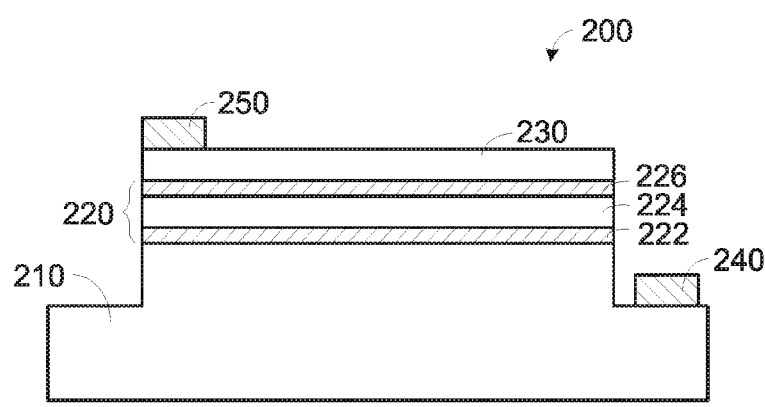
FIG. 2 is a schematic cross-sectional view illustrating a white LED according to a first embodiment of the present invention.

FIG. 2 is a schematic cross-sectional view illustrating a white LED according to a first embodiment of the present invention. As shown in FIG. 2, the white LED 200 comprises a P-type layer 210, a tunneling structure 220, an N-type layer 230, a P-type electrode 240, and an N-type electrode 250. The P-type layer 210 is a P-type substrate. The P-type layer 210 is used as a hole injection layer. The N-type layer 230 is used as an electron injection layer. Moreover, the tunneling structure 220 of the white LED 200 is a stack structure comprising a first barrier layer 222, an active layer 224 and a second barrier layer 226.

In this embodiment, all of the material layers 222, 224 and 226 of the tunneling structure 220 are metal nitride oxide layers. For example, the first barrier layer 222 and the second barrier layer 226 are made of aluminum oxynitride, and the active layer 224 is made of gallium oxynitride. Moreover, the P-type layer 210 is a heavily P-type doped (e.g. heavily boron-doped) <100> silicon substrate, and the N-type layer 230 is an N-type indium tin oxide (ITO) layer. Moreover, the P-type electrode 240 and the N-type electrode 250 are titanium/gold (Ti/Au) electrodes.

Figure 3A:
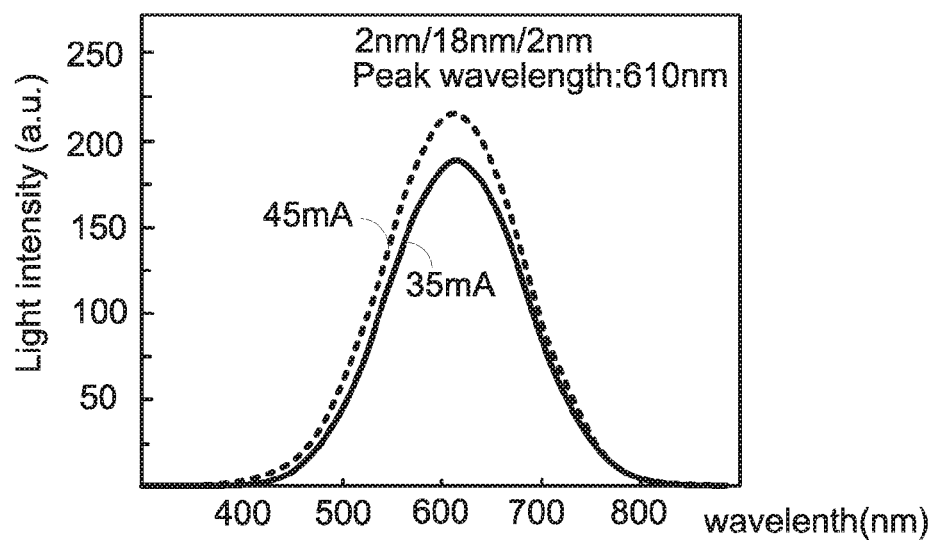
FIGS. 3A and 3B schematically illustrate the spectra of the white LED according to the first embodiment of the present invention, in which the thicknesses of the material layers of the tunneling structure are different.
Figure 3B:
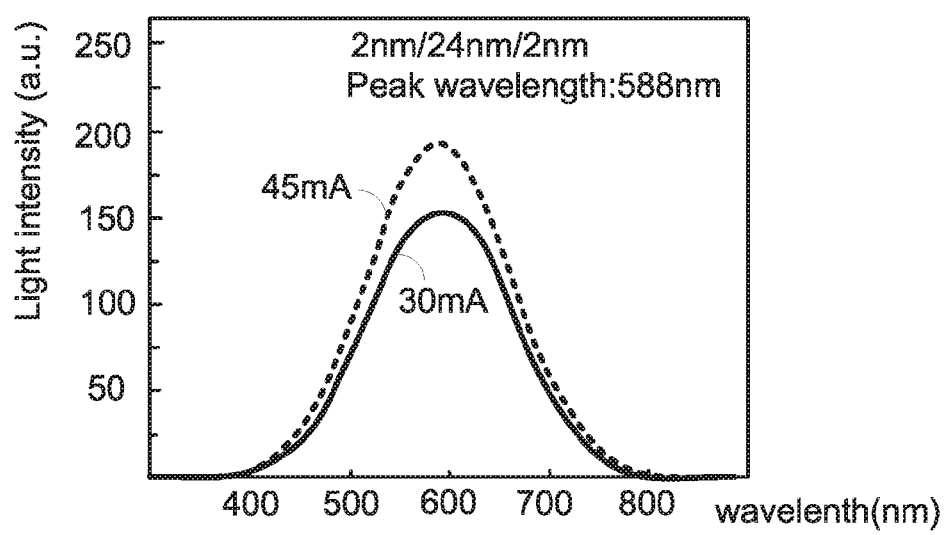

FIGS. 3A and 3B schematically illustrate the spectra of the white LED according to the first embodiment of the present invention, in which the thicknesses of the material layers of the tunneling structure are different. The light intensity is indicated by an arbitrary unit (a.u.).

FIG. 3A schematically illustrates a spectrum of the white LED of the first embodiment of the present invention. The thicknesses of the first barrier layer 222, the active layer 224 and the second barrier layer 226 of the tunneling structure 220 are 2 nm, 18 nm and 2 nm, respectively. Since the peak wavelength of the white LED is about 610 nm (driving current=35 mA or 45 mA), the white light is a warm white light.

FIG. 3B schematically illustrates a spectrum of the white LED of the first embodiment of the present invention. The thicknesses of the first barrier layer 222, the active layer 224 and the second barrier layer 226 of the tunneling structure 220 are 2 nm, 24 nm and 2 nm, respectively. Since the peak wavelength of the white LED is about 588 nm (driving current=30 mA or 45 mA), the white light is a cold white light.

Moreover, the P-type layer 210 is not restricted to the <100> silicon substrate. For example, in some embodiments, the P-type layer 210 is a <111> silicon substrate.

In the tunneling structure 220, the energy gap of the first barrier layer 222 and the energy gap of the second barrier layer 226 are both higher than the energy gap of the active layer 224. As mentioned above, the first barrier layer 222 and the second barrier layer 226 are made of aluminum oxynitride. In some other embodiments, the first barrier layer 222 and the second barrier layer 226 are made of the metal nitride oxide with higher energy gap. For example, the first barrier layer 222 and the second barrier layer 226 are made of gallium aluminum oxynitride, hafnium oxynitride, hafnium aluminum oxynitride or hafnium gallium oxynitride. Similarly, the active layer 224 is made of gallium oxynitride.

As mentioned above, the active layer 224 is made of gallium oxynitride. In some other embodiments, the active layer 224 is made of the metal nitride oxide with lower energy gap. For example, the active layer 224 is made of zinc oxynitride, gallium zinc oxynitride, gallium indium oxynitride or gallium indium aluminum oxynitride.

In this embodiment, the plural material layers 222, 224 and 226 of the tunneling structure 220 are metal nitride oxide layers. Moreover, by controlling the thicknesses of the plural material layers 222, 224 and 226 of the tunneling structure 220, the peak wavelength of the white LED is adjustable.

It is noted that numerous modifications and alterations may be made while retaining the teachings of the invention. For example, in another embodiment, the plural material layers 222, 224 and 226 of the tunneling structure 220 are the combination of metal nitride oxide layers and metal oxide layers. For example, the first barrier layer 222 and the second barrier layer 226 are made of metal oxide such as hafnium oxide ($HFO_2$), and the active layer 224 is made of metal nitride oxide such as gallium oxynitride. Alternatively, in another embodiment, the first barrier layer 222 and the second barrier layer 226 are made of metal nitride oxide such as aluminum oxynitride, and the active layer 224 is made of metal oxide such as zinc oxide (ZnO).

Figure 4:
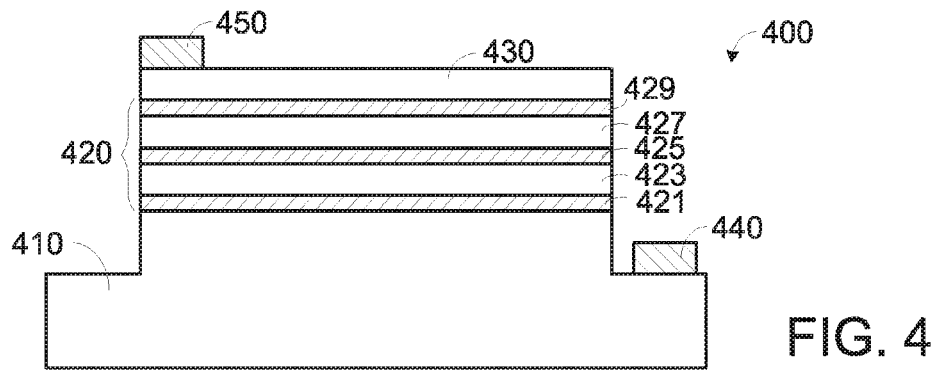
FIG. 4 is a schematic cross-sectional view illustrating a white LED according to a second embodiment of the present invention.

FIG. 4 is a schematic cross-sectional view illustrating a white LED according to a second embodiment of the present invention. The white LED comprises two active layers. As shown in FIG. 4, the white LED 400 comprises a P-type layer 410, a tunneling structure 420, an N-type layer 430, a P-type electrode 440, and an N-type electrode 450. The P-type layer 410 is a P-type substrate. The P-type layer 410 is used as a hole injection layer. The N-type layer 430 is used as an electron injection layer. The tunneling structure 420 of the white LED 400 is a stack structure comprising a first barrier layer 421, a first active layer 423, a second barrier layer 425, a second active layer 427 and a third barrier layer 429.

In this embodiment, all of the material layers 421, 423, 425, 427 and 429 of the tunneling structure 420 are metal nitride oxide layers. For example, the first barrier layer 421, the second barrier layer 425 and the third barrier layer 429 are made of aluminum oxynitride, and the first active layer 423 and the second active layer 427 are made of gallium oxynitride. Moreover, the P-type layer 410 is a heavily P-type doped (e.g. heavily boron-doped) <100> silicon substrate, and the N-type layer 430 is an N-type indium tin oxide (ITO) layer. Moreover, the P-type electrode 440 and the N-type electrode 450 are titanium/gold (Ti/Au) electrodes.

Figure 5A:
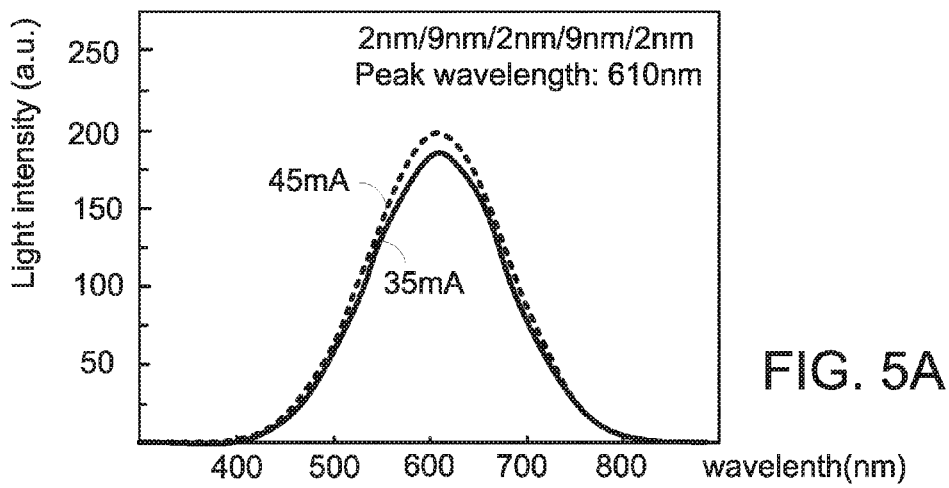
FIGS. 5A and 5B schematically illustrate the spectra of the white LED according to the second embodiment of the present invention, in which the thicknesses of the material layers of the tunneling structure are different.
Figure 5B:
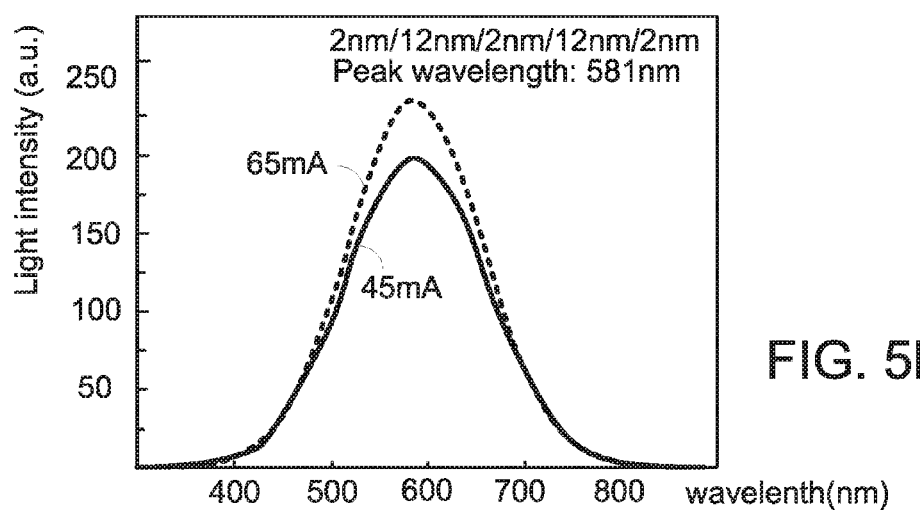

FIGS. 5A and 5B schematically illustrate the spectra of the white LED according to the second embodiment of the present invention, in which the thicknesses of the material layers of the tunneling structure are different. The light intensity is indicated by an arbitrary unit (a.u.).

FIG. 5A schematically illustrates a spectrum of the white LED of the second embodiment of the present invention. The thicknesses of the first barrier layer 421, the first active layer 423, the second barrier layer 425, the second active layer 427 and the third barrier layer 429 of the tunneling structure 420 are 2 nm, 9 nm, 2 nm, 9 nm and 2 nm, respectively. Since the peak wavelength of the white LED is about 610 nm (driving current=35 mA or 45 mA), the white light is a warm white light.

FIG. 5B schematically illustrates a spectrum of the white LED of the second embodiment of the present invention. The thicknesses of the first barrier layer 421, the first active layer 423, the second barrier layer 425, the second active layer 427 and the third barrier layer 429 of the tunneling structure 420 are 2 nm, 12 nm, 2 nm, 12 nm and 2 nm, respectively. Since the peak wavelength of the white LED is about 581 nm (driving current=45 mA or 65 mA), the white light is a warm white light.

Moreover, the P-type layer 410 is not restricted to the <100> silicon substrate. For example, in some embodiments, the P-type layer 410 is a <111> silicon substrate.

In the tunneling structure 420, the energy gaps of the barrier layers 421, 425 and 429 are higher than the energy gaps of the active layers 423 and 427. Consequently, in some other embodiments, the first barrier layer 421, the second barrier layer 425 and the third barrier layer 429 are made of the metal nitride oxide with higher energy gap. For example, the first barrier layer 421, the second barrier layer 425 and the third barrier layer 429 are made of gallium aluminum oxynitride, hafnium oxynitride, hafnium aluminum oxynitride or hafnium gallium oxynitride. Similarly, in some other embodiments, the first active layer 423 and the second active layer 427 are made of the metal nitride oxide with lower energy gap. For example, the first active layer 423 and the second active layer 427 are made of zinc oxynitride, gallium zinc oxynitride, gallium indium oxynitride or gallium indium aluminum oxynitride.

In this embodiment, the plural material layers 421, 423, 425, 427 and 429 of the tunneling structure 420 are metal nitride oxide layers. Moreover, by controlling the thicknesses of the plural material layers 421, 423, 425, 427 and 429 of the tunneling structure 420, the peak wavelength of the white LED is adjustable.

It is noted that numerous modifications and alterations may be made while retaining the teachings of the invention. For example, in another embodiment, the plural material layers 421, 423, 425, 427 and 429 of the tunneling structure 420 are the combination of metal nitride oxide layers and metal oxide layers.

For example, the first barrier layer 421, the second barrier layer 425 and the third barrier layer 429 are made of metal oxide such as hafnium oxide ($HFO_2$), and the first active layer 423 and the second active layer 427 are made of metal nitride oxide such as gallium oxynitride. Alternatively, in another embodiment, the first barrier layer 421, the second barrier layer 425 and the third barrier layer 429 are made of metal nitride oxide such as aluminum oxynitride, and the first active layer 423 and the second active layer 427 are made of metal oxide such as zinc oxide (ZnO).

The atomic constituents in the aluminum oxynitride layer and the gallium oxynitride layer of the tunneling structure are analyzed by an X-ray photoelectron spectroscopy (XPS). According to the XPS result, it is deduced that the chemical formula of the aluminum oxynitride layer is $(AlN)_x \bullet (Al_2O_3)_{1-x}$ and the chemical formula of gallium oxynitride layer is $(GaN)_y \bullet (Ga_2O_3)_{1-y}$. In the above formulae, x and y are positive values that are larger than zero and smaller than 1.

From the above descriptions, the white LED of the present invention comprises a tunneling structure. The tunneling structure is a stack structure comprising plural material layers. Especially, at least one of the plural material layers is made of metal nitride oxide.

When a bias voltage is applied to the white LED, the white LED generates a driving current. When the holes and electrons are introduced into the active layer (or a well region), the radiative recombination of the holes and electrons generates the white light. Moreover, by controlling the thicknesses of the plural material layers of the tunneling structure, the peak wavelength of the white LED is adjustable. Moreover, the white LED may be further packaged into a finished white LED module by any appropriate packaging method (e.g. a flip chip packaging method).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A white LED, comprising:
   a P-type layer;
   a tunneling structure in contact with the P-type layer, wherein the tunneling structure is a stack structure comprising a first barrier layer, a first active layer and a second barrier layer, wherein at least one of the first barrier layer, the first active layer and the second barrier layer is a first metal nitride oxide layer, and the first metal nitride oxide layer is an aluminum oxynitride layer or a gallium oxynitride layer;
   an N-type layer in contact with the tunneling structure;
   an N-type electrode in contact with the N-type layer; and
   a P-type electrode in contact with the P-type layer,
   wherein the aluminum oxynitride layer has a chemical formula of $(AlN)_x \bullet (Al_2O_3)_{1-x}$, and the gallium oxynitride layer has chemical formula of $(GaN)_y \bullet (Ga_2O_3)_{1-y}$, wherein x and y are positive values that are larger than zero and smaller than 1.

2. The white LED as claimed in claim 1, wherein the first barrier layer is the first metal nitride oxide layer, the second barrier layer is a second metal nitride oxide layer, and the first active layer is a first metal oxide layer.

3. The white LED as claimed in claim 1, wherein the first barrier layer is a first metal oxide layer, the second barrier layer is a second metal oxide layer, and the first active layer is the first metal nitride oxide layer.

4. The white LED as claimed in claim 1, wherein the first barrier layer is the first metal nitride oxide layer, the second barrier layer is a second metal nitride oxide layer, and the first active layer is a third metal nitride oxide layer.

5. The white LED as claimed in claim 1, wherein the tunneling structure is a stack structure comprising the first barrier layer, the first active layer, the second barrier layer, a second active layer and a third barrier layer.

6. The white LED as claimed in claim 1, wherein the P-type layer is a P-type <111> silicon substrate or a P-type <100> silicon substrate.

7. A white LED, comprising:
   a P-type layer;
   a tunneling structure in contact with the P-type layer, wherein the tunneling structure comprises plural material layers, and at least one of the plural material layers is a first metal nitride oxide layer, and the first metal nitride oxide layer is an aluminum oxynitride layer or a gallium oxynitride layer;
   an N-type layer in contact with the tunneling structure;
   an N-type electrode in contact with the N-type layer; and
   a P-type electrode in contact with the P-type layer,
   wherein the aluminum oxynitride layer has a chemical formula of $(AlN)_x \bullet (Al_2O_3)_{1-x}$, and the gallium oxynitride layer has chemical formula of $(GaN)_y \bullet (Ga_2O_3)_{1-y}$, wherein x and y are positive values that are larger than zero and smaller than 1.

8. The white LED as claimed in claim 7, wherein the plural material layers comprise a first barrier layer, a first active layer and a second barrier layer in a stack form, wherein the first barrier layer is the first metal nitride oxide layer, the second barrier layer is a second metal nitride oxide layer, and the first active layer is a first metal oxide layer.

9. The white LED as claimed in claim 7, wherein the plural material layers comprise a first barrier layer, a first active layer and a second barrier layer in a stack form, wherein the first barrier layer is a first metal oxide layer, the second barrier layer is a second metal oxide layer, and the first active layer is the first metal nitride oxide layer.

10. The white LED as claimed in claim 7, wherein the plural material layers comprise a first barrier layer, a first active layer and a second barrier layer in a stack form, wherein the first barrier layer is the first metal nitride oxide layer, the second barrier layer is a second metal nitride oxide layer, and the first active layer is a third metal nitride oxide layer.

11. The white LED as claimed in claim 7, wherein the plural material layers comprises a first barrier layer, a first active layer, a second barrier layer, a second active layer and a third barrier layer in a stack form.

12. The white LED as claimed in claim 7, wherein the P-type layer is a P-type <111> silicon substrate or a P-type <100> silicon substrate.

* * * * *